(12) United States Patent
Al-Shyoukh et al.

(10) Patent No.: US 10,511,273 B2
(45) Date of Patent: Dec. 17, 2019

(54) POWER TRANSFER DEVICE USING AN OSCILLATOR

(71) Applicant: Silicon Laboratories Inc., Austin, TX (US)

(72) Inventors: Mohammad Al-Shyoukh, Cedar Park, TX (US); Krishna Pentakota, Austin, TX (US); Stefan N. Mastovich, Round Rock, TX (US)

(73) Assignee: Silicon Laboratories Inc., Austin, TX (US)

( * ) Notice: Subject to any disclaimer, the term of this patent is extended or adjusted under 35 U.S.C. 154(b) by 45 days.

(21) Appl. No.: 15/835,230

(22) Filed: Dec. 7, 2017

(65) Prior Publication Data

US 2019/0181817 A1    Jun. 13, 2019

(51) Int. Cl.
| | |
|---|---|
| *H03F 3/217* | (2006.01) |
| *H02J 50/05* | (2016.01) |
| *H02J 50/80* | (2016.01) |
| *H02M 3/335* | (2006.01) |
| *H02M 5/458* | (2006.01) |

(Continued)

(52) U.S. Cl.
CPC ....... *H03F 3/217* (2013.01); *H01L 29/66106* (2013.01); *H02J 50/05* (2016.02); *H02J 50/80* (2016.02); *H02M 1/08* (2013.01); *H02M 3/3387* (2013.01); *H02M 3/33515* (2013.01); *H02M 5/458* (2013.01); *H02M 7/797* (2013.01); *H03F 3/2171* (2013.01); *H01L 29/66143* (2013.01); *H01L 29/7816* (2013.01); *H02H 9/005* (2013.01); *H02M 1/32* (2013.01); *H02M 1/34* (2013.01); *H02M 3/33592* (2013.01); *H02M 2001/0003* (2013.01); *H03F 3/04* (2013.01)

(58) Field of Classification Search
CPC ........................................................ H03F 3/217
USPC ........................................................ 307/104
See application file for complete search history.

(56) References Cited

U.S. PATENT DOCUMENTS

| | | |
|---|---|---|
| 7,489,526 B2 | 2/2009 | Chen et al. |
| 7,679,162 B2 | 3/2010 | Dupuis et al. |

(Continued)

OTHER PUBLICATIONS

Analog Devices, Inc., "Dual-Channel, 2.5 kV Isolators with Integrated DC-to-DC Converter," Data Sheet ADuM5200/ADuM5201/ADuM5202, 2009-2012, 28 pages.

(Continued)

*Primary Examiner* — Joseph Chang
(74) *Attorney, Agent, or Firm* — Zaborin Cave LLP

(57) ABSTRACT

A power transfer device includes an oscillator circuit having a first node, a second node, and a control terminal. The oscillator circuit includes a cascode circuit comprising transistors having a first conductivity type and a first breakdown voltage. The cascode circuit is coupled to the control terminal, the first node, and the second node. The oscillator circuit includes a latch circuit coupled between the cascode circuit and a first power supply node. The latch circuit includes cross-coupled transistors having the first conductivity type and a second breakdown voltage. The first breakdown voltage is greater than the second breakdown voltage. The oscillator circuit may be configured to develop a pseudo-differential signal on the first node and the second node. The pseudo-differential signal may have a peak voltage of at least three times a voltage level of an input DC signal on a second power supply node.

20 Claims, 12 Drawing Sheets

(51) Int. Cl.
*H02M 7/797* (2006.01)
*H02M 1/08* (2006.01)
*H01L 29/66* (2006.01)
*H02M 3/338* (2006.01)
*H02M 1/34* (2007.01)
*H02H 9/00* (2006.01)
*H03F 3/04* (2006.01)
*H01L 29/78* (2006.01)
*H02M 1/00* (2006.01)
*H02M 1/32* (2007.01)

(56) References Cited

U.S. PATENT DOCUMENTS

| | | |
|---|---|---|
| 7,706,154 B2 | 4/2010 | Chen et al. |
| 8,861,229 B2 | 10/2014 | Alfano et al. |
| 8,878,560 B2 | 11/2014 | Kuo et al. |
| 9,035,422 B2 | 5/2015 | Hanolkar et al. |
| 9,537,581 B2 | 1/2017 | Mills et al. |
| 9,698,654 B2 | 7/2017 | Santos et al. |
| 9,812,989 B1 | 11/2017 | Dupuis |
| 2002/0150151 A1 | 10/2002 | Krone et al. |
| 2003/0091140 A1 | 5/2003 | Dupuis et al. |
| 2004/0057524 A1 | 3/2004 | Krone et al. |
| 2004/0190670 A1 | 9/2004 | Dupuis et al. |
| 2005/0100104 A1 | 5/2005 | Dupuis et al. |
| 2006/0049881 A1* | 3/2006 | Rein ............... H03B 5/1847 331/74 |
| 2007/0075813 A1 | 4/2007 | Zhang |
| 2007/0080360 A1 | 4/2007 | Mirsky |
| 2007/0139032 A1 | 6/2007 | Dupuis et al. |
| 2007/0246805 A1 | 10/2007 | Zhang et al. |
| 2008/0013635 A1 | 1/2008 | Dupuis |
| 2008/0025450 A1 | 1/2008 | Alfano et al. |
| 2008/0031286 A1 | 2/2008 | Alfano et al. |
| 2008/0119142 A1 | 5/2008 | Dupuis |
| 2008/0164955 A1* | 7/2008 | Pfeiffer ............ H03B 5/1231 331/117 R |
| 2008/0192509 A1* | 8/2008 | Dhuyvetter ....... H02M 3/33523 363/17 |
| 2008/0260050 A1 | 10/2008 | Dupuis |
| 2008/0267301 A1 | 10/2008 | Alfano et al. |
| 2009/0017773 A1 | 1/2009 | Dupuis et al. |
| 2010/0052826 A1 | 3/2010 | Callahan et al. |
| 2010/0118918 A1 | 5/2010 | Dupuis |
| 2014/0153296 A1 | 6/2014 | Pan |
| 2015/0145446 A1 | 5/2015 | Shitabo |
| 2015/0171901 A1 | 6/2015 | Dupuis et al. |
| 2017/0346406 A1 | 11/2017 | Bucheru |

OTHER PUBLICATIONS

Analog Devices, Inc., "Hot Swappable, Dual I2C Isolators with Integrated DC-to-DC Converter," Data Sheet ADM3260, 2013-2016, 19 pages.
Analog Devices, Inc., "Quad-Channel, 5 kV Isolators with Integrated DC-to-DC Converter," Data Sheet ADuM6400/ADuM6401/ADuM6402/ADuM6403/ADuM6404, 2009-2012, 28 pages.
Silicon Laboratories, "1MBPS, 2.5KVRMS Digital Isolators," Si86xx, 2015, 52 pages.
Silicon Laboratories, "5 KV LED Emulator Input, Open Collector Output Isolators," Si87xx, 2014, 39 pages.
Silicon Laboratories, "Dual Digital Isolators with DC-DC Converter," Si88x2x, Jul. 2015, 45 pages.
Tsai, C.T., and Chou, H.P., "A Synthetic Ripple Buck Converter with Dynamic Hysteretic Band Modulation," International Conference on Power Electronics and Drive Systems, PEDS 2009, pp. 170-174.
Fanori, L. and Andreani, P., "Class-D CMOS Oscillators," IEEE Journal of Solid-State Circuits, vol. 48, No. 12, Dec. 2013, pp. 3105-3119.

* cited by examiner

POWER TRANSFER DEVICE USING AN OSCILLATOR

BACKGROUND

Field of the Invention

This invention relates to isolation technology and more particularly to providing power across an isolation barrier.

Description of the Related Art

Referring to FIG. 1, a conventional high-power system (e.g., a system having a power level greater than approximately 1 W) uses a power converter including standard transformer 109, e.g., a discrete transformer with a ferrite core and high efficiency to transfer power across the isolation barrier. Depending on the complexity of the drive circuitry, the conventional high-power system may achieve power transfer efficiencies of approximately 70%-approximately 95%. In order to regulate the output voltage, communications channel 104 provides any necessary feedback signals across the isolation barrier. Although the standard transformer implementation is efficient, the size and cost of the standard transformer implementation may be prohibitive for use in some applications. Thus, low-cost, isolated power transfer systems having high power transfer efficiency are desired.

SUMMARY OF EMBODIMENTS OF THE INVENTION

In at least one embodiment, a power transfer device includes an oscillator circuit. The oscillator circuit includes a first node, a second node, and a control terminal. The oscillator circuit includes a cascode circuit comprising transistors having a first conductivity type and a first breakdown voltage. The cascode circuit is coupled to the control terminal, the first node, and the second node. The oscillator circuit includes a latch circuit coupled between the cascode circuit and a first power supply node. The latch circuit includes cross-coupled transistors having the first conductivity type and a second breakdown voltage. The first breakdown voltage is greater than the second breakdown voltage. The oscillator circuit may include a first conductive coil coupled to the first node and the second node to form a primary-side circuit of the power transfer device. A center tap of the first conductive coil may be coupled to a second power supply node. The oscillator circuit may be configured to develop a pseudo-differential signal on the first node and the second node. The pseudo-differential signal may have a peak voltage of at least three times a voltage level of an input DC signal on the second power supply node. The oscillator circuit may be configured to convert an input DC signal on a second power supply node into a first AC signal in response to a control signal on the control terminal. The oscillator circuit may be configured to operate as a Class-D power amplifier.

In at least one embodiment, a method for operating a power transfer device includes converting an input DC signal into an output DC signal. The output DC signal is electrically isolated from the input DC signal. The converting includes biasing an oscillator circuit with the input DC signal. The converting includes generating a first AC signal by selectively enabling the oscillator circuit according to a received feedback signal and a status indicator indicating an operation status of a communications channel across an isolation barrier. The received feedback signal is received using the communications channel. The method may include generating the status indicator based on a change in signal level of the received feedback signal provided by the communications channel within a predetermined period. The method may include disabling the oscillator circuit for a predetermined period in response to the status indicator indicating a lack of change to a signal level of the received feedback signal within the predetermined period. The converting may include developing a pseudo-differential signal on a first node of the oscillator circuit and a second node of the oscillator circuit. The pseudo-differential signal may have a peak voltage of at least three times an input voltage level of the input DC signal. The transistors in a latch circuit of the oscillator circuit may each have a breakdown voltage that is just over the input voltage level. The converting may include clamping gate-to-source voltages of transistors in the latch circuit to a maximum voltage of the input voltage level. The converting may include limiting voltages on drain terminals of cascode devices in the oscillator circuit to be at most, just over three times the input voltage level. The limiting may snub non-fundamental modes of oscillation of the oscillator circuit and may return excess energy from the cascode devices to an input power supply node receiving the input DC signal. The converting may include converting the first AC signal into a second AC signal. The first AC signal may be electrically isolated from the second AC signal. The converting may include generating the output DC signal by rectifying the second AC signal. The output DC signal may be electrically isolated from the input DC signal. The converting may include generating a feedback signal based on the output DC signal and communicating the feedback signal across the isolation barrier using the communications channel.

In at least one embodiment, a power transfer device includes a primary-side circuit. The primary-side circuit includes an input power supply node configured to receive an input DC signal. The primary-side circuit includes an oscillator circuit configured as a power amplifier of a DC/AC power converter responsive to the input DC signal and an oscillator enable signal to provide a first AC signal. The primary-side circuit includes a circuit configured to generate the oscillator enable signal based on a received feedback signal and a status indicator indicating an operation status of a communications channel across an isolation barrier. The received feedback signal is received via the communications channel. The circuit includes a timer configured to assert a timeout signal in response to a lack of change of a state of the received feedback signal within a predetermined period.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

A low-cost, power transfer device includes a transformer formed on an insulating substrate disposed on conductive structures within an integrated circuit package. A primary winding of the transformer is coupled to a first integrated circuit to form a DC/AC power converter and a secondary winding of the transformer is coupled to a second integrated circuit to form an AC/DC power converter. The first and second integrated circuits are electrically isolated from each other, i.e., no current flows between the first and second integrated circuits.

Figure 1:
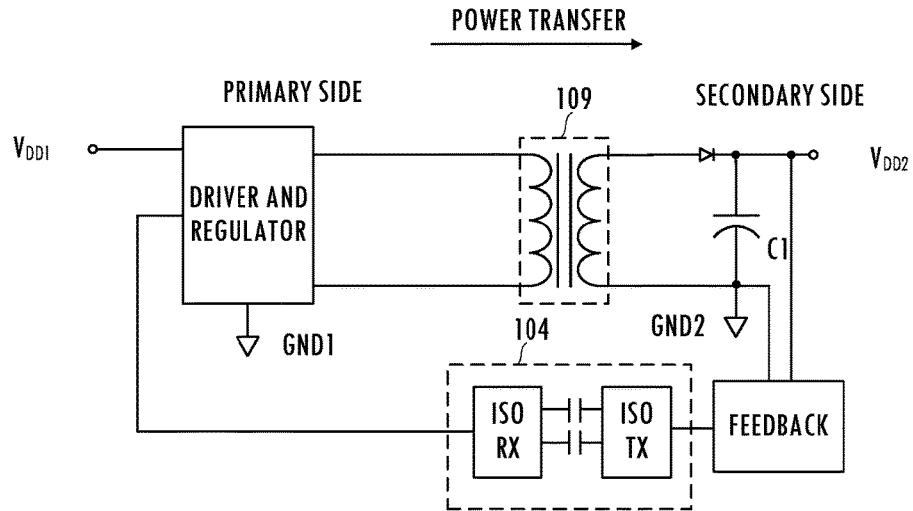
FIG. 1 illustrates a functional block diagram of a conventional circuit for transferring power across an isolation barrier using feedback to regulate the output signal.
Figure 2:
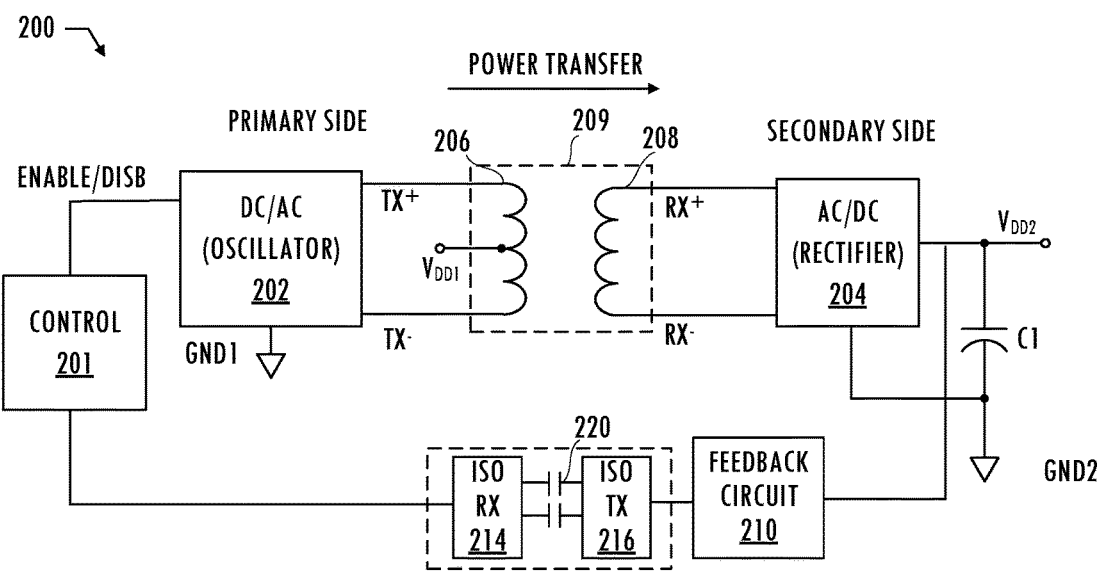
FIG. 2 illustrates a functional block diagram of a system for transferring power across an isolation barrier using feedback to regulate the output signal.

Referring to FIG. 2, power transfer device 200 includes DC/AC power converter circuit 202, which uses input DC signal $V_{DD1}$ to bias conductive coil 206 of transformer 209, and AC/DC power converter circuit 204, which uses conductive coil 208 of transformer 209 to drive capacitor C1. In at least one embodiment, an oscillator circuit includes conductive coil 206 and DC/AC power converter circuit 202 to form a fast-starting oscillator stage configured to operate as a Class-D power amplifier that is configured as a primary-side power converter stage. This primary-side power converter stage may be tuned to oscillate with a particular frequency, e.g., approximately 60 MHz-400 MHz, using variable capacitors. Power transfer device 200 regulates output voltage $V_{DD2}$ by turning on and off DC/AC power converter circuit 202 using feedback information received from feedback circuit 210 via capacitive channel 220 to communicatively couple electrically isolated integrated circuits. Capacitive channel 220 communicates the feedback information across an isolation barrier from the secondary side to the primary side. The feedback may be provided as a digital signal communicated across the isolation barrier using transmitter 216 and receiver 214 that implement on-off keying (OOK) modulation of the information transmitted across capacitive channel 220.

Figure 3:
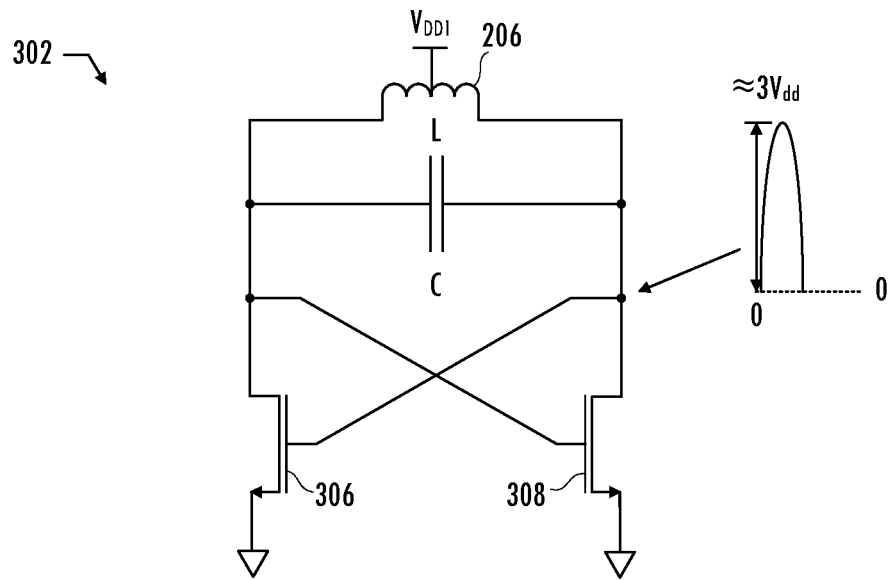
FIG. 3 illustrates a circuit diagram of an exemplary oscillator circuit.

In at least one embodiment, the primary-side power converter stage formed by conductive coil 206 and the oscillator in DC/AC power converter circuit 202 operates as a high-efficiency Class-D power amplifier. Class-D operation may cause a pseudo-differential signal on nodes TX+ and TX− to have peak voltage levels (e.g., 15 V) up to, or slightly greater than, $3.2 \times V_{DD1}$. Such voltage levels are not tolerated by conventional CMOS devices (e.g., conventional CMOS transistors operate up to $1.2 \times V_{DD1}$). Conventional oscillator circuit 302 of FIG. 3, which includes a latch circuit formed from conventional n-type transistor 306 and n-type transistor 308, is inadequate to support the high gate-to-source voltage levels and drain-to-source voltage levels of the target specifications for the primary-side power converter stage.

Figure 4:
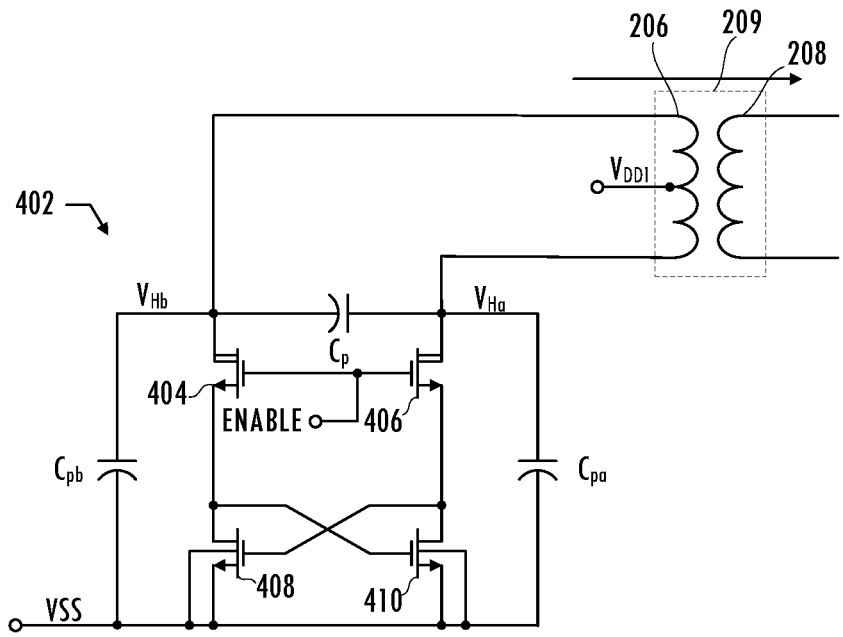
FIGS. 4-7 and 9 illustrate circuit diagrams of exemplary oscillator circuits including a latch circuit and a cascode circuit consistent with embodiments of the invention.

Referring to FIG. 4, in at least one embodiment, oscillator circuit 402 includes a latch circuit formed by latch transistor 408 and latch transistor 410, which are n-type transistors cross-coupled to each other and coupled to cascode transistor 404 and cascode transistor 406, which are also n-type transistors. Latch transistor 408 and latch transistor 410 are on the primary side (e.g., low voltage side) of the power transfer device and are configured to pump energy into the LC tank circuit of oscillator circuit 402 at a frequency that is determined by passive system elements. Conductive coil 206 (i.e., the primary-side winding of transformer 209) can experience voltages as high as $3 \times V_{DD1}$ due to the Class-D mode operation (e.g., the pseudo-differential signal on nodes $V_{Ha}$ and $V_{Hb}$ having voltage levels in a range between $2.6 \times V_{DD1}$ and $3.2 \times V_{DD1}$) of oscillator circuit 402. Oscillator circuit 402 is selectively enabled via cascode transistors 404 and 406, which can cut off the current path to transformer 209. The Class-D operation of oscillator circuit 402 reduces transition times between the on (i.e., conducting) portion of oscillator circuit 402 and the off (i.e., non-conducting) portion of oscillator circuit 402, which realizes near-instant- or near-zero voltage switching in the primary-side power converter stage, thereby increasing efficiency by limiting the time duration in which both n-type transistors consume power and reducing or eliminating overshoots or undesired transients in the delivery of energy to the secondary-side power converter stage.

In at least one embodiment of oscillator circuit 402, cascode transistor 404 and cascode transistor 406 are laterally-diffused drain metal oxide semiconductor (LDMOS) transistors engineered for a high breakdown voltage. An exemplary LDMOS transistor can sustain high drain-to-source voltages (e.g., tens of Volts) while having low equivalent on-resistances (Rdson) in response to being driven into the linear mode of transistor operation. In at least one embodiment of the power transfer device, transistor 404 and transistor 406 are 18 V LDMOS n-type transistors, which are available in an exemplary manufacturing process for mixed-signal integrated circuits (e.g., a bipolar-CMOS-DMOS manufacturing process). Other transistors used by oscillator circuit 402 (e.g., latch transistor 408 and latch transistor 410) are conventional 5 V CMOS devices that have a breakdown voltage that is just over $V_{DD1}$ (e.g., a breakdown voltage in a range greater than 5 V, but less than 6 V). Cascode transistor 404 and cascode transistor 406 shield the latch circuit from high voltages. The drain terminals of cascode transistor 404 and cascode transistor 406 can support high drain-to-source voltage swings while corresponding gate-to-source voltages are maintained within reliability limits determined by gate oxide thicknesses of the transistors (e.g., $V_{gs}$<6 V).

For a voltage level of input DC signal $V_{DD1}$ equal to 5 V, drains of cascode transistor 404 and cascode transistor 406 will see voltages slightly higher than $3 \times V_{DD1}$=15 V. Cascode transistor 404 and cascode transistor 406 enable fast restart of the oscillator by presenting a sudden large voltage (e.g., a voltage above the latch crossover point, i.e., the point at which the gate-to-source voltage of latch transistor 410 equals the gate-to-source voltage of latch transistor 408) across latch transistor 408 and latch transistor 410. Voltages applied to latch transistor 408 and latch transistor 410 are precisely controlled so that those transistors enter the triode mode of operation and turn off at an appropriate time with little or no crossover time (i.e., the transition time when latch transistor 408 and latch transistor 410 are conducting in the active mode of operation). Each of latch transistor 408 and latch transistor 410 conducts during approximately one half of the cycle and does not conduct during the other half of the cycle. The capacitor of oscillator circuit 402 can be fully differential ($C_p$), single-ended ($C_{pa}$ and $C_{pb}$) or a combination of fully differential and single-ended. Every 2 C units of capacitance on each single-ended branch is equivalent to C fully differential units. The total equivalent capacitance seen by the oscillator circuit is $C_p$ $C_{p(a,b)}/2$.

Figure 5:
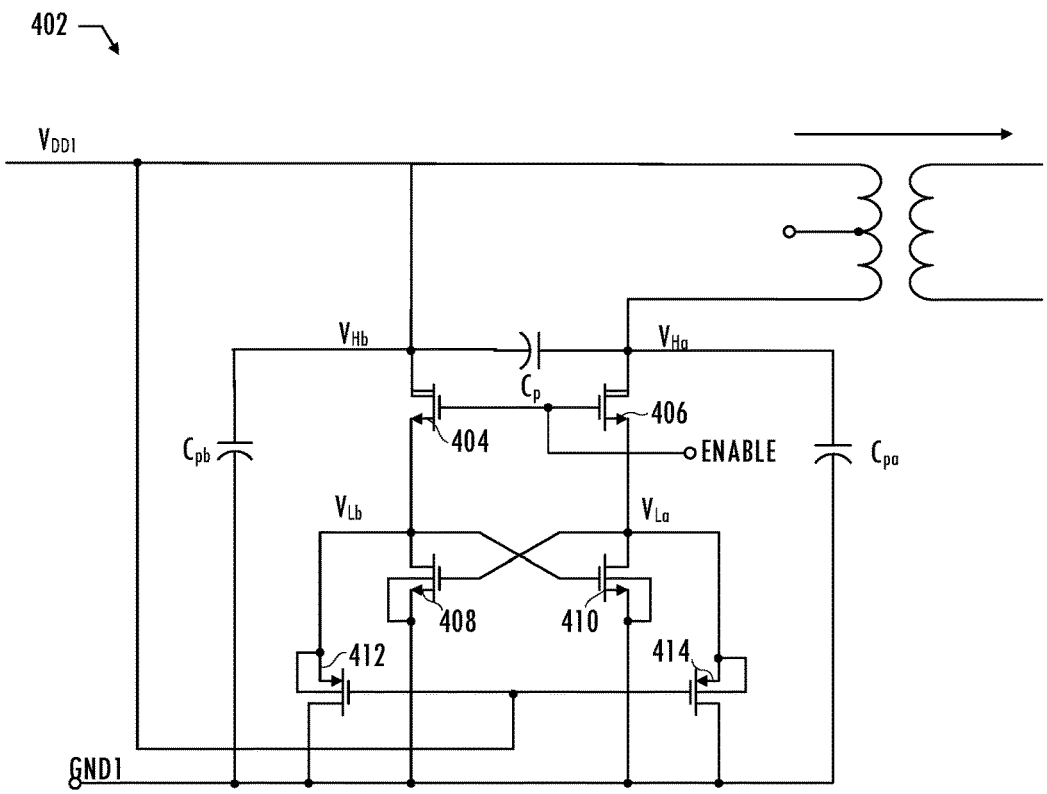

Referring to FIG. 5, in at least one embodiment, oscillator circuit 402 includes clamp transistor 412 and clamp transistor 414 coupled to the gate terminal of latch transistor 410 and the gate terminal of latch transistor 408, respectively. Clamp transistor 412 and clamp transistor 414 limit the gate-to-source voltages of latch transistor 408 and latch transistor 410, respectively, to a maximum of approximately $V_{DD1}+|V_{tp}|$. Clamp transistor 412 and clamp transistor 414 are p-type transistors configured to suppress any substantial coupling across the drain-to-source parasitic overlap capacitance of cascode transistor 404 and cascode transistor 406, respectively, if cascode transistor 404 and cascode transistor 406 try to lift the gate-to-source voltages of latch transistor 408 and latch transistor 410, respectively, above $V_{DD1}+|V_{tp}|$. For an exemplary 5 V CMOS process, $V_{DD1}$ is 5 V and $|V_{tp}|$ is approximately 1 V, and the clamping occurs at approximately 6 V, which is close to the maximum gate-to-source voltage that a conventional 5 V transistor can withstand.

Figure 6:
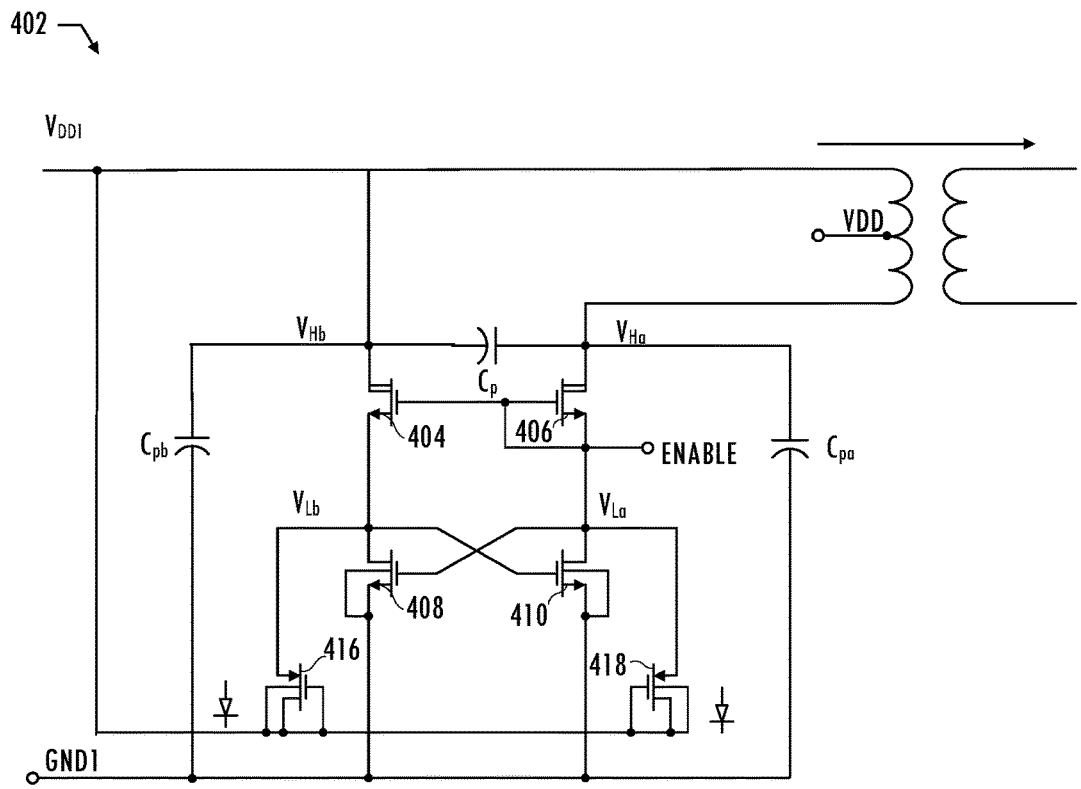

Referring to FIG. 6, in at least one embodiment, oscillator circuit 402 includes clamp transistor 416 and clamp transistor 418 having source terminals coupled to the gate terminal of latch transistor 410 and the gate terminal of latch transistor 408, respectively. Clamp transistor 416 and clamp transistor 418 each include a bulk terminal, a gate terminal, and a drain terminal that are coupled to the power supply node providing input DC signal $V_{DD1}$. Note that clamp transistor 416 and clamp transistor 418 are p-type transistors that have their n-type bulk terminal coupled to a corresponding drain node and not to a corresponding source node (i.e., a higher voltage node), as in typical clamp transistor configurations. The configuration of clamp transistor 416 and clamp transistor 418 results in two conduction paths for each clamp transistor: a channel conduction path and a body diode conduction path. Two conduction paths for each clamp transistor makes this configuration faster than the typical clamp transistor configuration. Clamp transistor 416 and clamp transistor 418 limit the voltages of node $V_{La}$ and node $V_{Lb}$. If the voltages on node $V_{La}$ or node $V_{Lb}$ exceeds $V_{DD1}$, then both the channel diode and the body diode of clamp transistor 416 and clamp transistor 418 start conducting, thereby clamping the gate voltages of latch transistor 410 and latch transistor 408. Clamp transistor 416 and clamp transistor 418 are configured to return part of the clamped energy back to the power supply, thereby increasing the efficiency of oscillator circuit 402.

Figure 7:
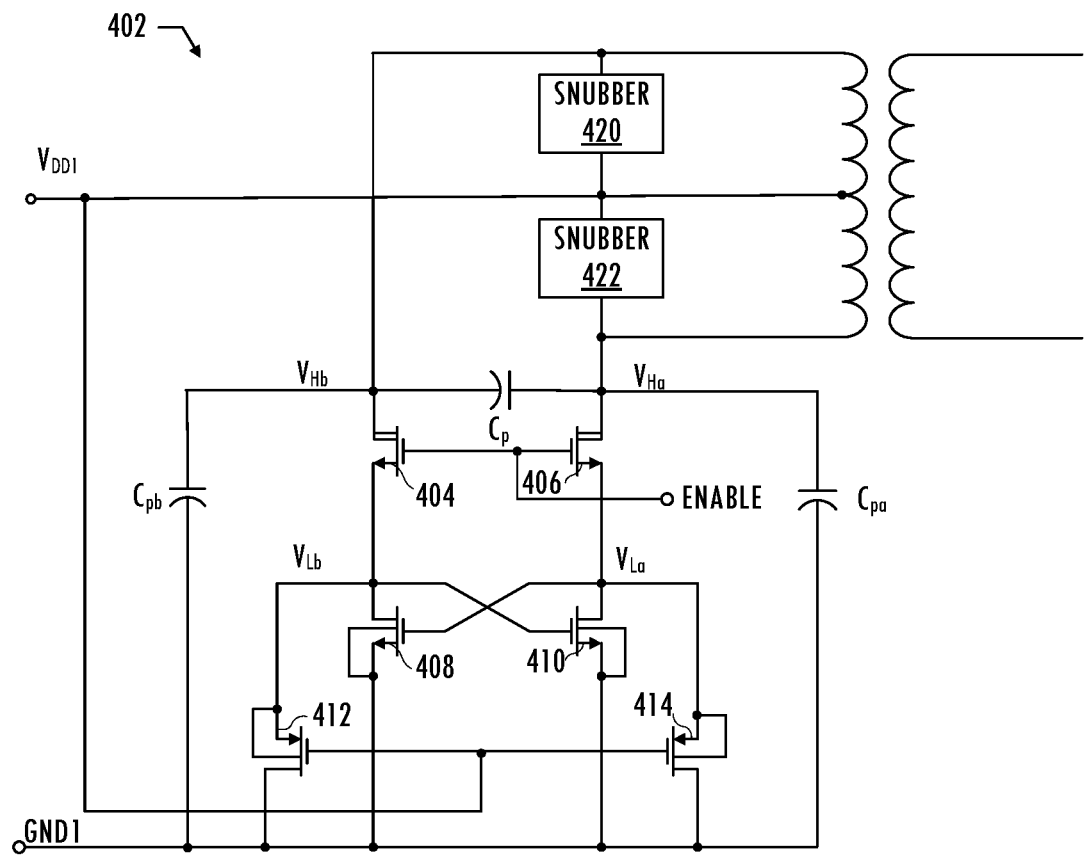
Figure 8:
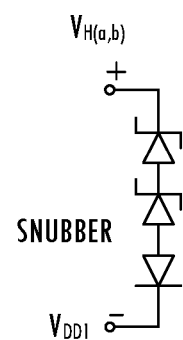
FIG. 8 illustrates a circuit diagram of an exemplary snubber circuit of FIGS. 7 and 9 consistent with embodiments of the invention.
Figure 9:
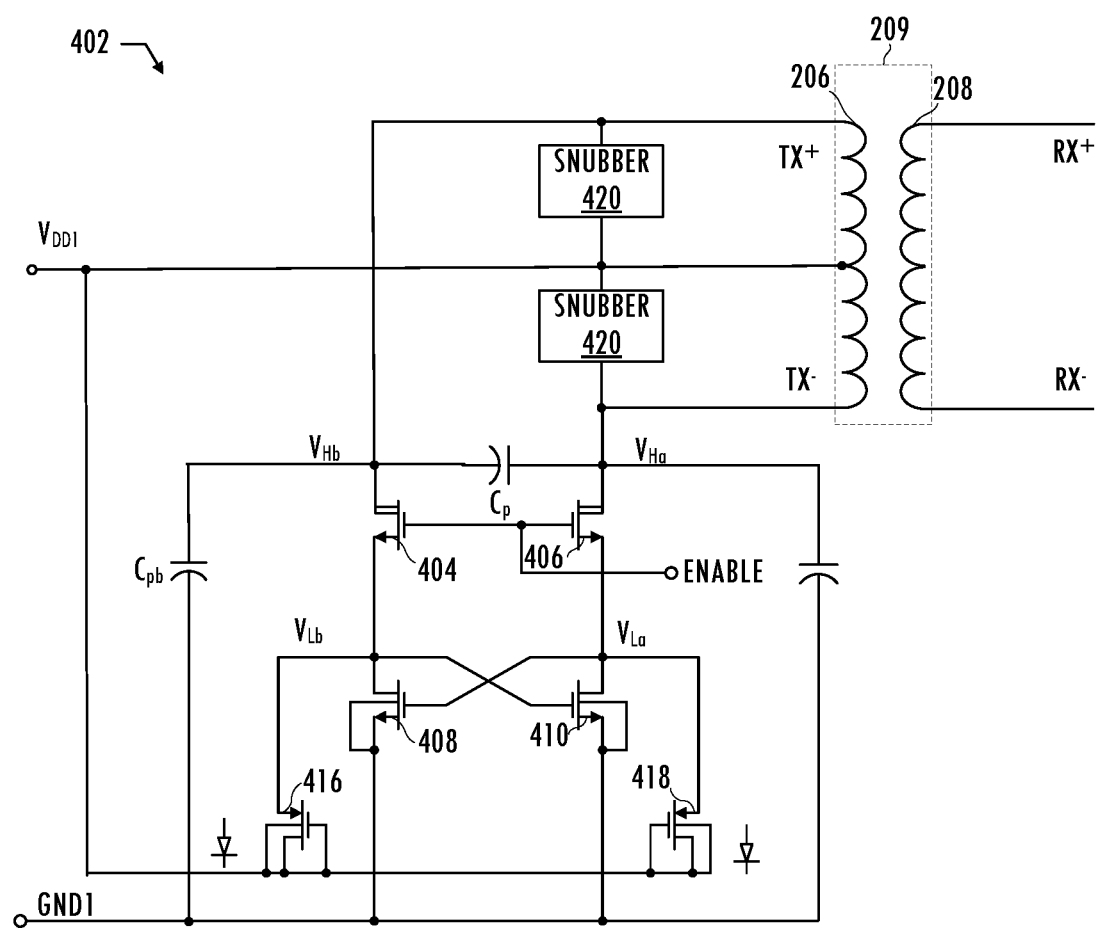
Figure 10:
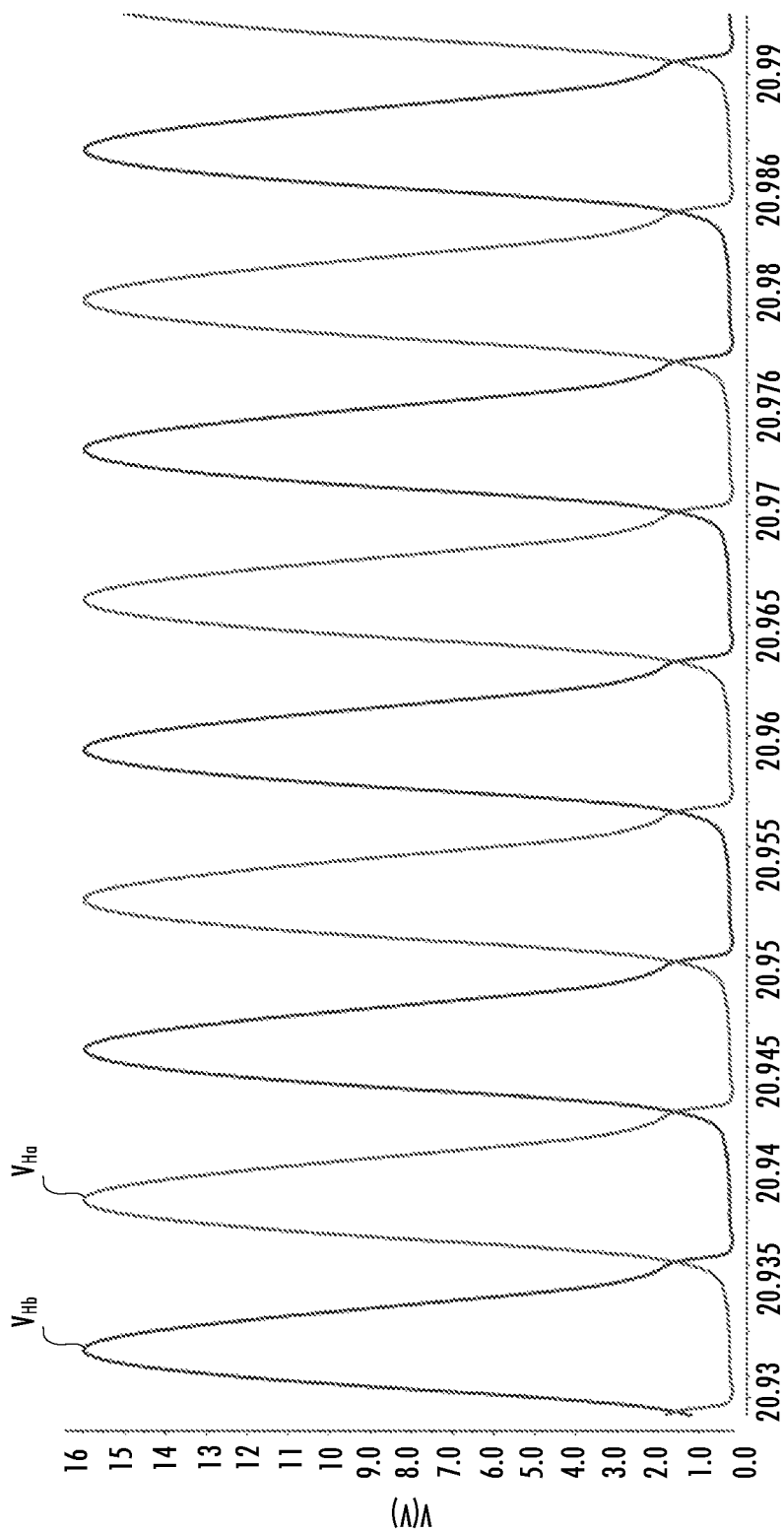
FIG. 10 illustrates exemplary signal waveforms of the pseudo-differential signal generated by oscillator circuits of FIGS. 4-7 and 9 consistent with embodiments of the invention.
Figure 11:
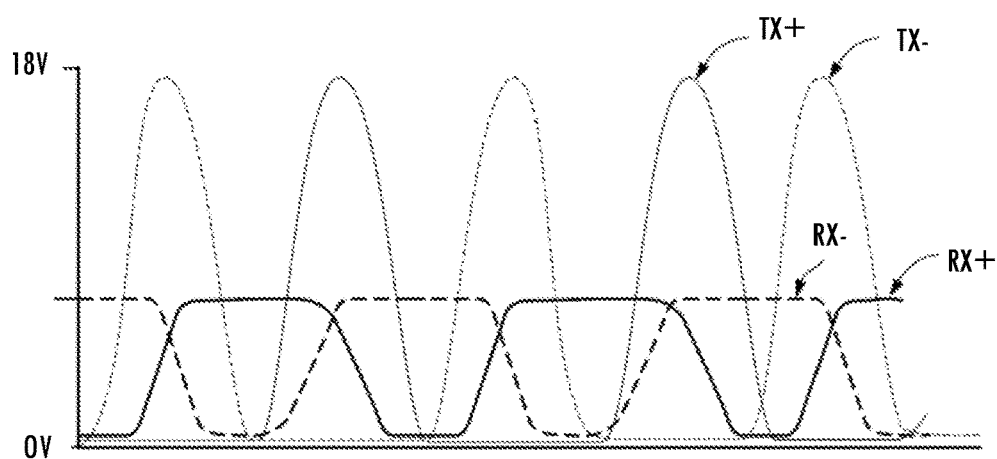
FIG. 11 illustrates exemplary signal waveforms for the isolated power transfer system of FIG. 2.

The enable mechanism for controlling oscillator circuit 402 needs a mechanism that reduces or eliminates excess energy that builds up in the transformer coils upon restart and that can cause flying voltages on the terminals of the transformer (i.e., voltage levels much greater than $3 \times V_{DD1}$ that develop on either node $V_{Ha}$ or node $V_{Hb}$ as a result of releasing that excess energy to the capacitor(s) of the oscillator (e.g., $C_p$, $C_{pa}$, $C_{pb}$) as the oscillator restarts oscillating). Referring to FIGS. 7-9, embodiments of oscillator circuit 402 include snubber circuit 420 and snubber circuit 422 coupled to the drain terminal of cascode transistor 404 and the drain terminal of cascode transistor 406, respectively. Snubber circuit 420 and snubber circuit 422 prevent the voltage on the drain terminal of cascode transistor 404 and the voltage on the drain terminal of cascode transistor 406, respectively, from substantially exceeding $3 \times V_{DD1}$. As a result, snubber circuit 420 and snubber circuit 422 reduce or eliminate any non-fundamental modes of oscillation (i.e., modes of oscillation with an effective oscillation frequency other than $$f = \frac{1}{2\pi\sqrt{LC}}$$

and force clean, well-bounded oscillation of oscillator circuit 402. In addition, snubber circuit 420 and snubber circuit 422 return at least part of the excess energy to the power supply. Snubber circuit 420 and snubber circuit 422 may be sized to have a clamping voltage level just above $3 \times V_{DD1}$. In at least one embodiment of oscillator circuit 402, snubber circuit 420 and snubber circuit 422 each include series-coupled, reverse-biased Zener diodes coupled in series with series-coupled, forward-biased diodes. Accordingly, the clamping voltage level equals $N_1 \times V_Z + N_2 \times V_F$, where $N_1$ and $N_2$ are integers greater than zero, $V_Z$ is a knee voltage of the Zener diodes, and $V_F$ is a forward voltage of the forward-biased diodes. Referring to FIG. 10, waveforms for oscillator circuit 402 illustrate pseudo-differential signals on nodes $V_{Hb}$ and $V_{Ha}$, with peak voltages slightly higher than $3 \times V_{DD1}$.

Figure 12:
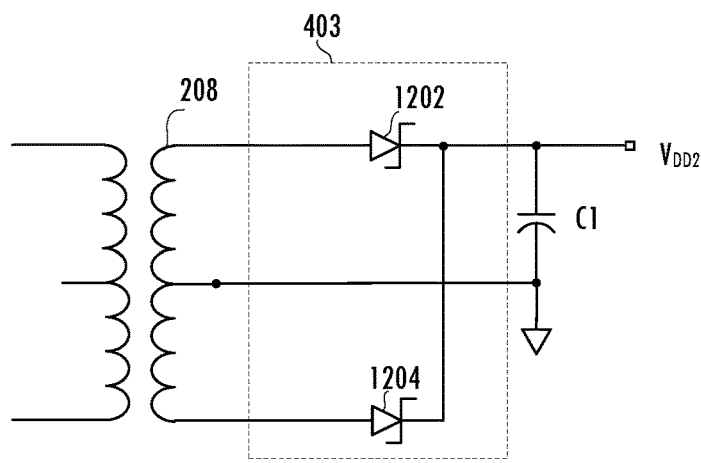
FIGS. 12-14 illustrate circuit diagrams of exemplary rectifier circuits consistent with at least one embodiment of the invention.

Referring to FIG. 2, oscillator circuit 202 converts input DC signal $V_{DD1}$ to an AC signal (e.g., the pseudo-differential signal on nodes TX+ and TX−). Transformer 209 converts that AC signal into a second AC signal (e.g., the pseudo-differential signal on nodes RX+ and RX−). AC/DC power converter circuit 204 receives the second AC signal from conductive coil 208 and converts the second AC signal (e.g., the pseudo-differential signal on nodes RX+ and RX−) into output DC signal $V_{DD2}$ that is electrically isolated from the input DC signal $V_{DD1}$. AC/DC power converter circuit 204 includes a full-wave rectifier circuit. Referring to FIGS. 2 and 12, in at least one embodiment, to improve the efficiency of power transfer device 200 as compared to efficiency realized by conventional power transfer devices, conductive coil 208 includes a center tap coupled to a ground node and rectifier circuit 403 includes Schottky diode 1202 and Schottky diode 1204.

In general, a Schottky diode (i.e., hot carrier diode) is a semiconductor diode formed by a junction of a semiconductor with a metal and is characterized to have a fast switching speed and low voltage drop. The Schottky diode can sustain high forward currents at lower voltage drops than would exist in typical diffused pn-junction diodes. An exemplary Schottky diode forward voltage is approximately 150 mV-450 mV, while a typical silicon diode has a forward voltage of approximately 600 mV-700 mV. The lower forward voltage requirement improves system efficiency. Typically, Schottky diodes are not available in conventional CMOS manufacturing technologies because their manufacture requires additional mask layers and processing steps. However, Schottky diodes may be available with conventional CMOS devices in an exemplary mixed-signal integrated circuit manufacturing process (e.g., bipolar-CMOS-DMOS manufacturing process). Schottky diode 1202 and Schottky diode 1204 withstand voltages of greater than 10 V in a typical application. The secondary-side half-windings alternate rectifying and adding charge to capacitor C1. Since only half of the transformer delivers power to the output capacitor for a particular half-cycle, the output voltage that can be developed across C1 is limited. However, only one Schottky diode contributes to conduction losses according to which path is conducting at a particular time. Schottky diodes that have high current density and relatively low reverse breakdown voltage may be used to reduce area of the rectifier circuit. If Schottky diodes are not available, regular diodes may be used, but result in a lossier system.

Figure 13:
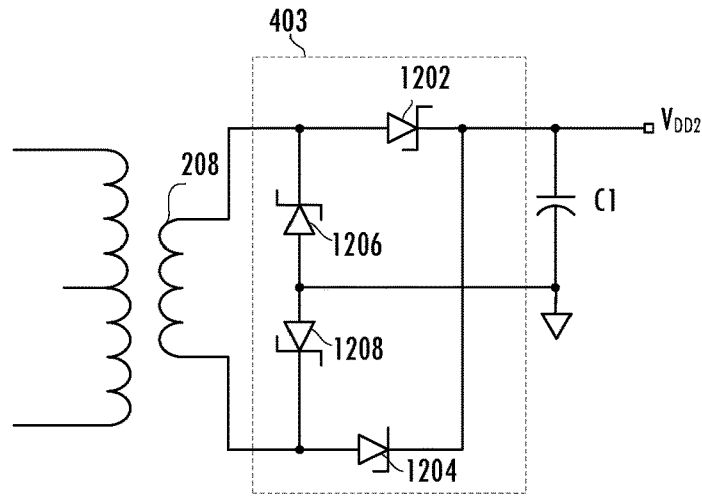

Referring to FIG. 13, in at least one embodiment of a power transfer device, rectifier circuit 403 includes conductive coil 208 with an unconnected center tap. Instead of a two-diode rectification structure, rectifier circuit 403 includes a four-diode rectification structure. Diode 1204, diode 1206, diode 1208, and diode 1210 are Schottky diodes, but regular diodes, which have higher losses across the diode, may be used. The embodiment of FIG. 13 allows a larger range of output voltage levels for output DC signal $V_{DD2}$ since the entirety of conductive coil 208 delivers energy to the load during each half-cycle, as compared to the embodiment of FIG. 12. However, the embodiment of FIG. 13 has increased conduction losses because the average output load current conducts across two diodes and incurs two diode forward-voltage drops, instead of one diode forward-voltage drop of the embodiment of FIG. 12.

Figure 14:
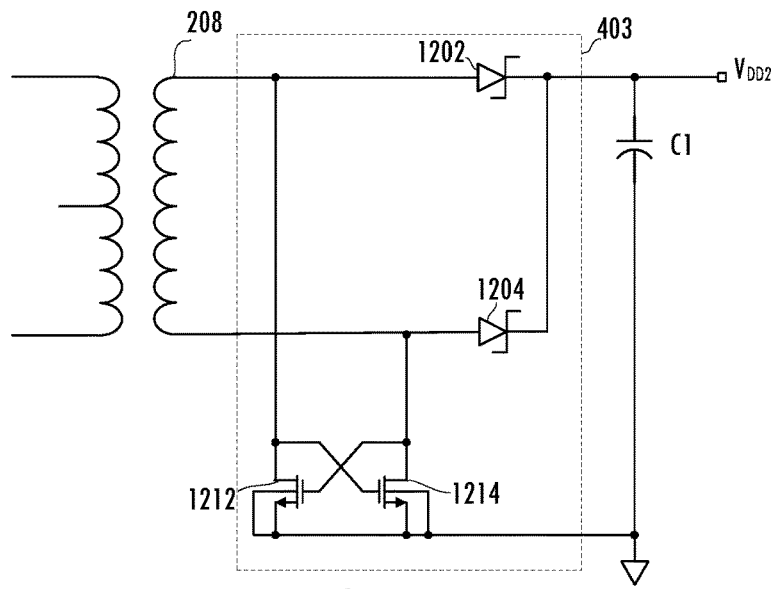
Figure 15:
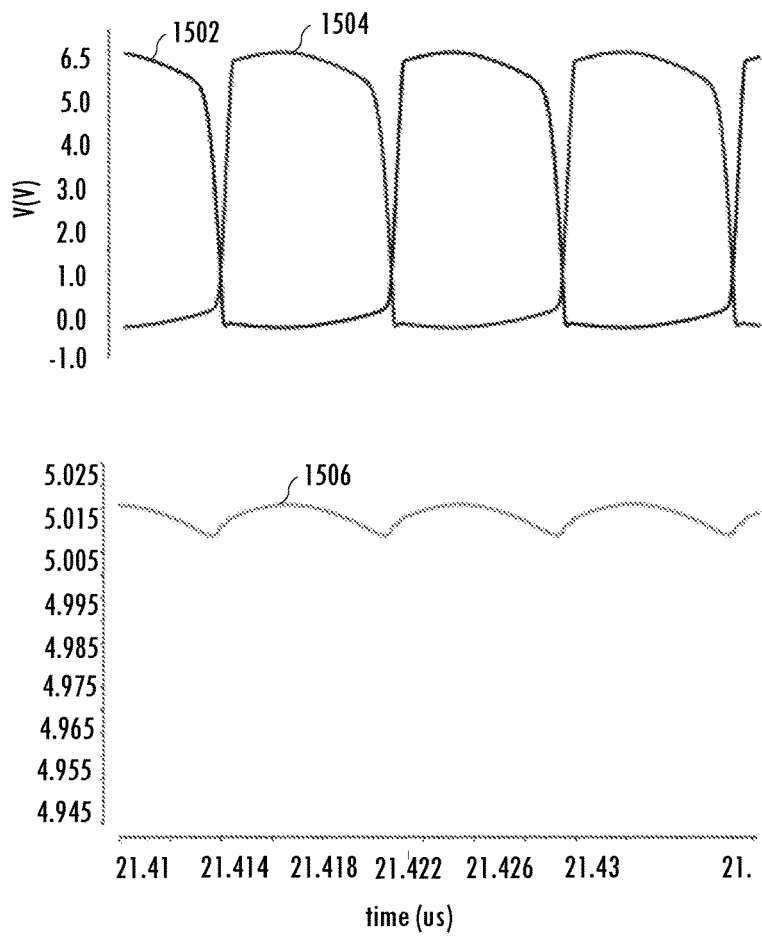
FIG. 15 illustrates exemplary waveforms for half-cycle signals and associated output signal of the rectifier circuit of FIG. 14.

Replacing diode 1208 and diode 1210 of the embodiment of FIG. 13 with transistors 1212 and 1214 of FIG. 14, improves efficiency of rectifier circuit 403 by reducing conduction losses and the voltage drop across transistor 1212 and transistor 1214 can be made lower than the forward voltage drop of the Schottky diodes, as compared to the embodiment of FIG. 13. Referring to FIG. 14, in at least one embodiment, rectifier circuit 403 includes Schottky diode 1202 and Schottky diode 1204 integrated with conventional CMOS devices (e.g., cross-coupled n-type transistor 1212 and n-type transistor 1214). Conductive coil 208 is not coupled at a center tap. Regulating the output voltage level at an output DC signal $V_{DD2}$ such that $V_{DD2}+V_F$ falls below the maximum gate-to-source voltage of transistor 1212 and transistor 1214 alleviates reliability concerns related to the maximum gate-to-source voltage of transistor 1212 and transistor 1214. When either of transistor 1212 or transistor 1214 of FIG. 14 conducts (e.g., the path through transistor 1214, conductive coil 208, and diode 1202 or the path through transistor 1212, conductive coil 208, and diode 1204), both the channel and the body diode of transistor 1212 conduct, thus reducing conduction losses as compared to the four-diode embodiment of FIG. 13. Referring to FIGS. 14 and 15, waveform 1502 illustrates conduction through transistor 1212, conductive coil 208, and diode 1204 and waveform 1504 illustrates conduction through transistor 1214, conductive coil 208, and diode 1202. Waveform 1506 illustrates the rectified DC voltage (5 V) developed as the output DC signal $V_{DD2}$ across capacitor C1.

Figure 16:
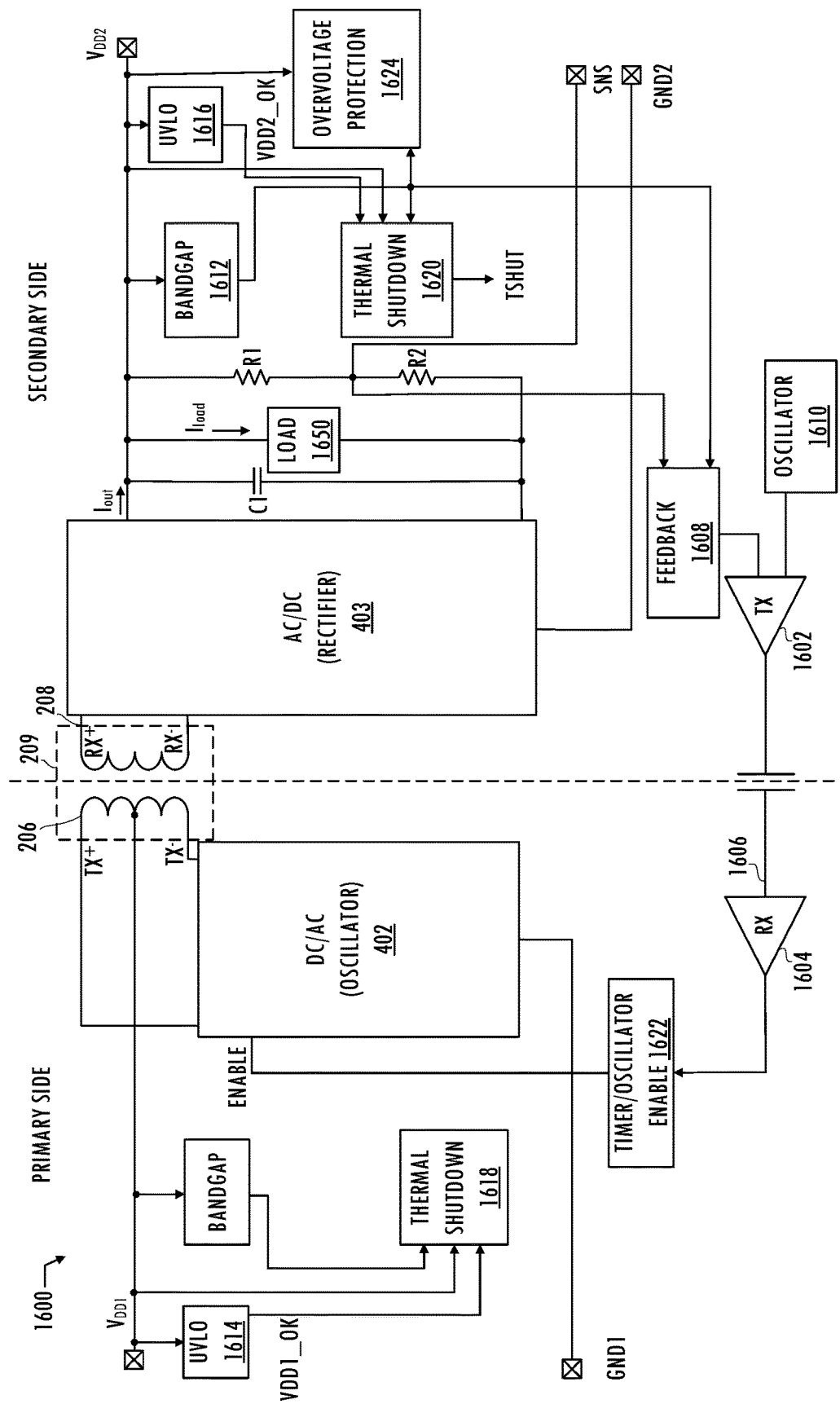
FIG. 16 illustrates a functional block diagram of a system for transferring power across an isolation barrier using feedback to regulate the output voltage consistent with at least one embodiment of the invention.
Figure 17:
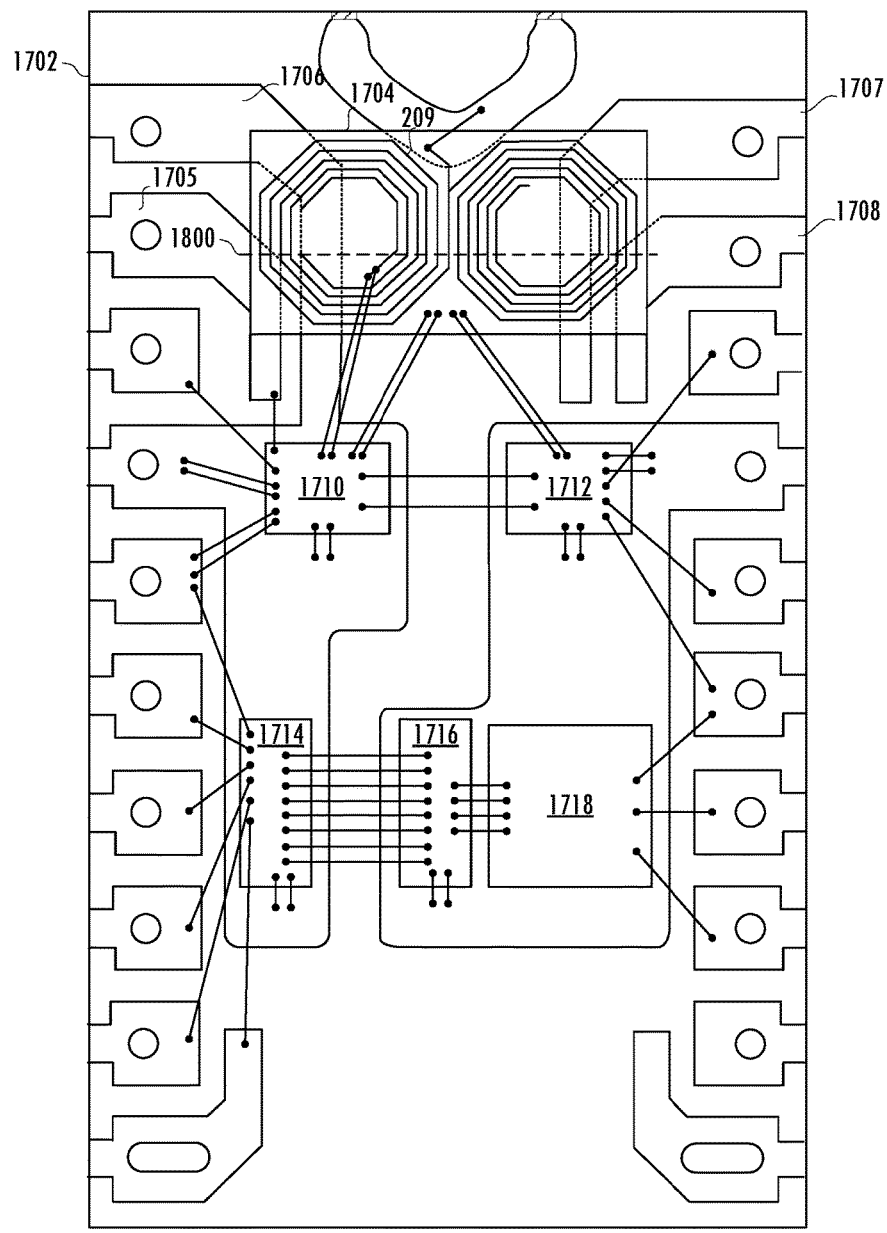
FIG. 17 illustrates a plan view of a packaged power transfer device consistent with at least one embodiment of the invention.

Referring to FIG. 16, power transfer device 1600 includes oscillator circuit 402 coupled to conductive coil 206, and is configured to deliver energy from a first voltage domain across an isolation barrier via transformer 209, which delivers power to a second voltage domain of load 1650 via second conductive coil 208 and rectifier circuit 403. Typically, load 1650 and capacitor C1 are external to a package housing power transfer device 1600. Oscillator circuit 402 is controlled with an enable/disable signal that controls the amount of energy delivered to the secondary side of transformer 209, thereby regulating output DC signal $V_{DD2}$. Referring to FIGS. 16 and 17, power transfer device 1600 isolates the first voltage domain on the primary side from the second voltage domain on the secondary side and allows data transfer between the primary side and the secondary side. No external DC-to-DC converter is necessary to power up the second voltage domain. Transformer 209 is an air core transformer that is integrated in package 1702 (e.g., a wide body small outline integrated circuit (WBSOIC) package). Integration of transformer 209 in power transfer device 1600 reduces bill of material costs and board space requirements of a voltage isolation system in an intended application (e.g., industrial and automotive applications).

Figure 18:
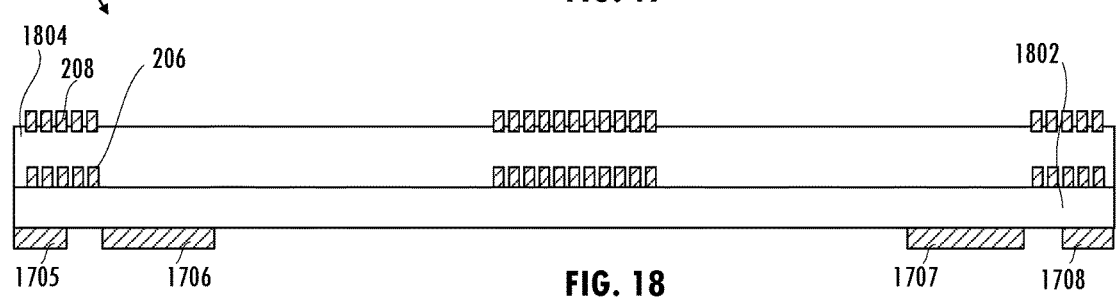
FIG. 18 illustrates a cross-sectional view of an air-core transformer of the packaged power transfer device of FIG. 17 consistent with at least one embodiment of the invention.

FIGS. 17 and 18 illustrate a plan view of package 1702 housing power transfer device 1600 and transformer 209 and a cross-sectional view of cross-section 1800 of transformer 209 disposed on conductors in package 1702. In at least one embodiment, transformer 209 is an air core transformer with a 1:N turns ratio, where N can be approximately one. Each conductive coil of transformer 209 includes two turns each, and has a planar spiral structure. However, one of skill in the art will appreciate that the teachings herein can be utilized with other transformers using other turn ratios and/or other numbers of turns per coil. Transformer 209 converts the AC electrical energy on the primary side into magnetic flux, which is coupled into the secondary side of power transfer device 1600. Transferring energy from the primary side to the secondary side requires reinforced isolation, i.e., the primary and secondary sides of transformer 209 need to be able to withstand voltage surges greater than 5 kV RMS. Accordingly, the material used in the core of the transformer that isolates conductive coil 206 from conductive coil 208 needs to be able to withstand voltage surges greater than 5 kV RMS. Transformer 209 has a physical design and is formed using materials that reduce series resistance of conductive coil 206 and conductive coil 208 and improve the quality factor of the transformer 209, which increases the efficiency of transformer 209.

In at least one embodiment, package 1702 houses power transfer device 1600 and transformer 209 is formed using insulating substrate 1802. Insulating substrate 1802 is a glass substrate having a high transition temperature (i.e., a high Tg, e.g., Tg of at least approximately 150 C) and a low dielectric constant (e.g., borosilicate glass, e.g., Tg of approximately 150), a resin-based substrate (e.g., Bismaleimide-Triazine (BT)), or a glass-reinforced epoxy laminate (FR-4). By forming transformer 209 on insulating substrate 1802, transformer 209 can be disposed directly on conductor 1705, conductor 1706, conductor 1707, and conductor 1708, which may be formed from plated copper or other conductor within package 1702. Although insulating substrate 1802 is physically in contact with conductor 1705, conductor 1706, conductor 1707, and conductor 1708, transformer 209 is electrically isolated from conductor 1705, conductor 1706, conductor 1707, and conductor 1708, thereby reducing physical size requirements for a package housing transformer 209 in conjunction with other integrated circuits of power transfer device 1600. For example, integrated circuit 1710 includes oscillator circuit 402, integrated circuit 1712 includes rectifier circuit 403, integrated circuit 1718 includes feedback and fault tolerance circuitry, integrated circuit 1714 includes communication channel receiver circuitry, and integrated circuit 1716 includes communication channel transmitter circuitry. However, in at least one embodiment of power transfer device 1600, circuits of integrated circuit 1712, integrated circuit 1716, and integrated circuit 1718 (e.g., rectifier circuit 403, feedback and fault tolerant circuitry, and isolation channel transmitter circuitry) are integrated in fewer integrated circuit die or a single integrated circuit die that are/is coupled to transformer device 1704. Similarly, in at least one embodiment of power transfer device 1600, circuits of integrated circuit 1710 and integrated circuit 1714 (e.g., oscillator circuit 402 and communication channel receiver circuitry) are integrated in a single integrated circuit die that is coupled to transformer device 1704.

Integrated circuit 1710 and integrated circuit 1712 are coupled to transformer device 1704 using wire bonding or other integrated circuit interconnect. In at least one embodiment, first conductive coil 206 is formed from a conductive layer followed by conventional photolithographic patterning. For example, a conductive layer (e.g., a copper layer) is formed on insulating substrate 1802. A photoresist is applied and a reticle including a pattern for first conductive coil 206 is used to selectively expose the photoresist material. The manufacturing process removes unwanted material (e.g., unwanted material is etched away). Instead of a subtractive patterning process, an additive patterning process may be used to form conductive structures only in regions that need the material. Insulating layer 1804 is formed on first conductive coil 206. Then, second conductive coil 208 and interconnection structures (not shown) are formed on insulating layer 1804. Insulating layer 1804 may be any low dielectric constant material having a high dielectric strength (e.g., epoxy-based photoresist, high temperature polyimides, silicon dioxide or other thin film material having a dielectric constant of less than 10). Thus, conductive coil 206 and conductive coil 208 are formed in different layers on insulating substrate 1802. Transformer 209 may include ground pins to increase heat dissipation and reduce junction temperature rise. Transformer 209 may include two-turn conductive coils that have dimensions that reduce electromagnetic interference (e.g., symmetrical coils with current flow in opposing directions) and achieve sufficient efficiency.

Referring to FIGS. 16 and 17, feedback circuit 1608 is a hysteretic circuit that regulates output DC signal $V_{DD2}$ based on voltage $V_{SNS}$ on a terminal SNS, which is a voltage-divided version of output DC signal $V_{DD2}$ generated by a resistor divider network. Hysteresis is used to generate a feedback signal that controls oscillator circuit 402 to maintain the output voltage level of output DC signal $V_{DD2}$ within a target voltage range. In an exemplary embodiment of power transfer device 1600, $V_{DD2,MAX}$ is 5.02 V and $V_{DD2,MIN}$ is 4.98 V, resulting in an average regulated $V_{DD2}$ value of 5.0 V. The resistor divider network may be on-chip (e.g., integrated circuit 1712 or integrated circuit 1718), off-chip (e.g., resistor R1 and resistor R2 are implemented using discrete transistors in package 1702) and/or are external to package 1702 and coupled via one or more pins of package 1702. In at least one embodiment of power transfer device 1600, only one pin (e.g., terminal SNS) is required to control output DC signal $V_{DD2}$ and a hysteretic band of the voltage regulator of feedback circuit 1608, although in other embodiments, additional pins may be used.

Referring to FIGS. 16 and 19-21, feedback circuit 1608 includes comparator 1902, which compares voltage $V_{SNS}$ on terminal SNS to reference voltage $V_{REF}$ (e.g., a reference voltage generated by bandgap reference circuit 1612. When comparator 1902 detects that voltage $V_{SNS}$ exceeds first threshold voltage $V_{DD2,MAX}$, which is based on reference voltage $V_{REF}$, the output of comparator 1902 changes output signal levels. In typical steady-state operation, (e.g., TSHUT configures lockout circuit 1910 to pass a driven version of the output of comparator 1902), transmitter 1602 communicates the output of comparator 1902 from the secondary side to the primary side across the isolation barrier. The output of comparator 1902 may be converted to a modulated signal for transmission. For example, transmitter 1602 uses oscillator 1610 for on-off keying modulation to communicate a digital representation of the output of comparator 1902 across capacitive channel 1606 to receiver 1604. The primary side generates ENABLE/DISABLE_B based on the received digital signal and controls oscillator circuit 402 accordingly (e.g., disables cascode transistors in oscillator circuit 402 to pause power transfer). When oscillator circuit 402 is disabled, load 1650 on the secondary side starts to discharge capacitor C1. As a result, the voltage level of output DC signal $V_{DD2}$ drops at a rate equal to $$\frac{dvDD2}{dt} = -\frac{I_{load}}{C1}.$$

After the voltage level of output DC signal $V_{DD2}$ crosses second threshold voltage $V_{DD2,MIN}$, comparator 1902 changes the level of its output signal. The change in voltage level is communicated from the secondary side to the primary side across the isolation barrier. That change in level causes the primary side to enable oscillator circuit 402, which causes the voltage level of output DC signal $V_{DD2}$ to ramp up again. Output DC signal $V_{DD2}$ may have a small AC ripple at twice the oscillator frequency caused by the rectifier. That AC ripple is present only when the oscillator is on and when the voltage level of output DC signal $V_{DD2}$ is ramping up to first threshold voltage $V_{DD2,MAX}$. An inherent delay of the received ON and OFF signals generated by on-off keying signaling causes a small DC offset of output DC signal $V_{DD2}$ that may be reduced by reducing delay of the feedback channel.

Figure 19:
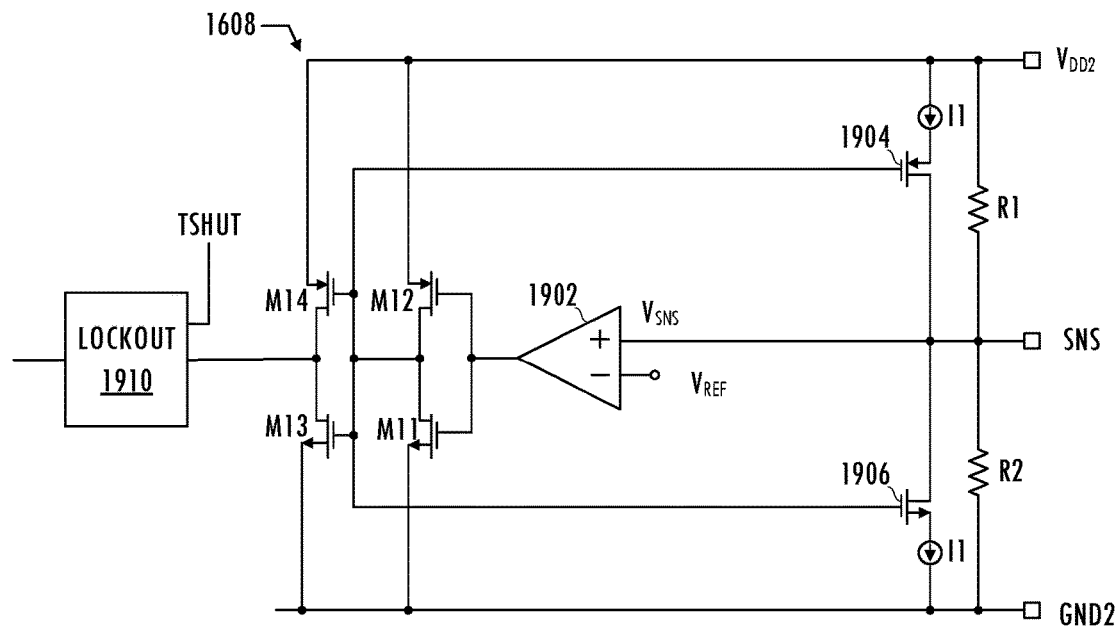
FIGS. 19 and 20 illustrate circuit diagrams of exemplary embodiments of the feedback circuit of FIG. 16 consistent with at least one embodiment of the invention.

Referring to FIGS. 16 and 19, the reference voltage $V_{REF}$ and the ratio of resistances of resistor R1 and resistor R2 determines the voltage level of output DC signal $V_{DD2}$ since $$V_{DD2} = V_{REF} \times \frac{(R1 + R2)}{R2}.$$

Hysteretic thresholds, first threshold voltage $V_{DD2,MAX}$ and second threshold voltage $V_{DD2,MIN}$ are programmed to target levels using a current I1 that is sourced by p-type transistor 1904 or sunk by n-type transistor 1906 to/from the resistor network including resistor R1 and resistor R2:

$$V_{DD2,MAX} = \frac{V_{ref}(R_1 + R_2)}{R_2} + I_1 R_1$$

$$V_{DD2,MIN} = \frac{V_{ref}(R_1+R_2)}{R_2} - I_1 R_1.$$

Accordingly, a hysteretic band of the feedback signal is controlled independently of the voltage level of output DC signal $V_{DD2}$ by using analog techniques:

$V_{HYS}=V_{DD2,MAX}-V_{DD2,MIN}=2\times I1\times R1$. Oscillator circuit 402 provides a fixed DC current to the secondary side and the load capacitor. At steady state, when the voltage level of output DC signal $V_{DD2}$ moves between first threshold voltage $V_{DD2,MAX}$ and second threshold voltage $V_{DD2,MIN}$, capacitor C1 charges at a constant rate of approximately $$\frac{dVDD2}{dt} = \frac{I_{out}-I_{load}}{C1}$$

and discharges at a constant rate of approximately $$\frac{dvDD2}{dt} = -\frac{I_{load}}{C1}.$$

At steady-state, $$\frac{dvDD2}{dt} = V_{HYS}.$$

Therefore, $$t_{off} = C1 \times \frac{V_{HYS}}{I_{load}}$$

and the frequency of enabling and disabling of oscillator circuit 402 to achieve voltage regulation is $$\frac{1}{t_{on}+t_{off}},$$

which is a function of C1, $V_{HYS}$, and $I_{load}$, and may vary according to particular manufacturing conditions. The frequency of feedback channel may be adjusted by selecting appropriate values for C1 and $V_{HYS}$ for particular load conditions.

Figure 20:
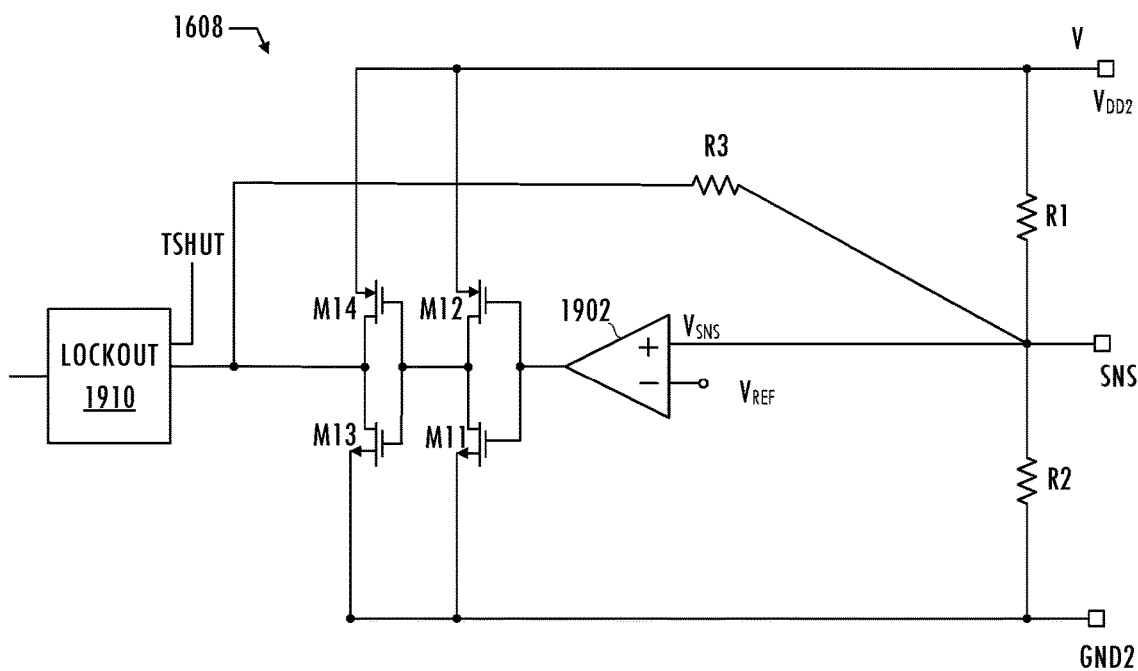
Figure 21:
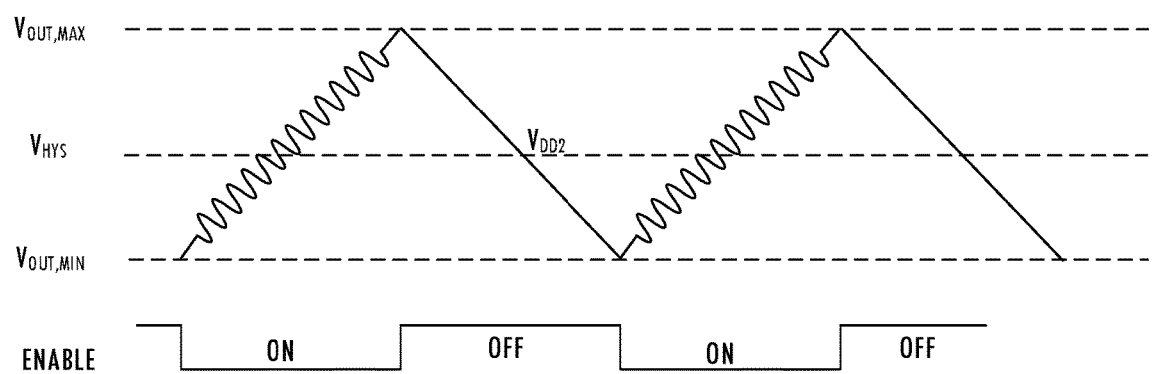
FIG. 21 illustrates exemplary signal waveforms for the isolated output voltage and enable signal of FIG. 16.

Referring to FIG. 20, in at least one embodiment of feedback circuit 1608, rather than using current sources, resistor R3, is included in addition to resistor R1 and resistor R2:

$$V_{DD2,MAX} = \frac{(R_1 R_2 + R_1 R_3 + R_2 R_3)V_{ref}}{R_2 R_3};$$

and $$V_{DD2,MIN} = \frac{V_{ref}(R_1 R_2 + R_1 R_3 + R_2 R_3)}{(R_1+R_3)R_2}.$$

Contrary to the embodiment described above where the average voltage level of output DC signal $V_{DD2}$ is defined by $$V_{REF} \times \frac{(R1+R2)}{R2}$$

with a symmetrical hysteresis band $V_{HYS}=2\times I1\times R1$ evenly distributed around the average voltage level of output DC signal $V_{DD2}$, the upper and lower hysteresis thresholds of the embodiment of FIG. 20 are defined by more elaborate equations that are more complex to calculate. Nevertheless, the circuit provides the target upper and lower hysteretic thresholds using a simpler implementation. Resistor R3 may be included internally to the integrated circuit while resistor R1 and resistor R2 remain external to allow programmability of the hysteretic band and output voltage level using a single pin of the device by selection of first resistance of resistor R1 and second resistance of resistor R2.

Referring to FIG. 16, in at least one embodiment of power transfer device 1600, thermal shutdown circuit 1618 and thermal shutdown circuit 1620 protect power transfer device 1600 from over-temperature events, which may occur due to ambient temperature being out of a specified range, or due to a fault in power transfer device 1600. Thermal shutdown circuit 1618 generates a primary-side thermal shutdown control signal in response to the temperature on a primary side integrated circuit exceeding a predetermined junction temperature (e.g., 150 C). The primary-side thermal shutdown control signal may be used by timer/oscillator enable circuit 1622 to disable oscillator circuit 402, which is the predominate source of power dissipation of power transfer device 1600. While oscillator circuit 402 is disabled, the junction temperature of power transfer device 1600 decreases, thereby protecting devices of the primary side. Similarly, on the secondary side, thermal shutdown circuit 1620 generates a corresponding thermal shutdown control signal in response to the temperature on the secondary side integrated circuit exceeding a predetermined junction temperature (e.g., 150 C). A secondary-side thermal shutdown control signal may be used by feedback circuit 1608 to provide a feedback signal that, when transmitted across the isolation channel, disables oscillator circuit 402, thereby allowing the junction temperature of power transfer device 1600 to decrease and protect devices on the secondary side. The primary side and the secondary side can cause a thermal shutdown of oscillator circuit 402 independently.

Referring to FIG. 16, in at least one embodiment of power transfer device 1600, undervoltage lockout circuit 1614 and undervoltage lockout circuit 1616 reduce or eliminate erroneous operation during device startup and device shutdown, or when input DC signal $V_{DD1}$ has a level below its specified operating range. The primary side and secondary side can cause power transfer device 1600 to enter or exit an undervoltage lockout state independently. Undervoltage lockout circuit 1614 prevents false turn-on or false turn-off of oscillator circuit 402. Undervoltage lockout circuit 1614 generates a gating signal using a voltage detector that detects if the voltage level of input DC signal $V_{DD1}$ is stable and has crossed a predetermined threshold voltage. Gating logic on the primary side generates gating signal VDD1_OK, which is used by thermal shutdown circuit 1618 to configure circuitry to reduce or eliminate excessive transient currents when the power supply is still coming up and has not yet stabilized. Gating all logic on the primary side with gating signal VDD1_OK reduces or eliminates incorrect decisions made in the control path due to low supply voltage from turning off oscillator circuit 402. Similarly, on the secondary side, undervoltage lockout circuit 1616 monitors output DC signal $V_{DD2}$. If the voltage level of output DC signal $V_{DD2}$ crosses a predetermined threshold voltage, undervoltage lockout circuit 1616 generates control signal VDD2_OK that is used by thermal shutdown circuit 1620 to enable the output of feedback circuit 1608 to regulate the voltage level of output DC signal $V_{DD2}$.

In at least one embodiment, power transfer device 1600, oscillator circuit 402 includes the LC tank-based oscillator having a cross-coupled n-type transistor latch, as described above, which limits the peak current that can flow through transformer 209. When the secondary side is shorted to ground due to a fault, the peak current limitation of oscillator circuit 402 reduces or eliminates excessive current draw from an input node providing input DC signal $V_{DD1}$. Those limits on the peak current are described as follows:

$$Ipeak_{primary} = \frac{2 \times V_{DD1}}{2\pi f_0 L(1-k^2) + R_s};$$

and $$Ipeak_{secondary} = k \times \frac{2 \times V_{DD1}}{2\pi f_0 L(1-k^2) + R_s},$$

where k is the mutual inductance of the transformer, and $R_S$ is the equivalent series resistance of the primary winding. In an exemplary embodiment, the inductance of conductive coil 206, L=100 nH, the fundamental frequency of oscillator circuit 402, $f_0$=75 MHz, and k=0.6, and $R_S$=1.4Ω. Accordingly, $Ipeak_{primary}$ is approximately 316 mA and $Ipeak_{secondary}$ is approximately 200 mA.

In at least one embodiment, power transfer device 1600, includes timer/oscillator enable circuit 1622 on the primary side. Timer/oscillator enable circuit 1622 improves fault tolerance of power transfer device 1600 in response to malfunctioning of the feedback channel. The feedback channel may be inoperative in response to a fault condition on the secondary side or if the load is pulled to ground via a small, finite resistance causing the oscillator circuit 402 to continuously transfer power to the secondary side. The continuous transfer of power from the primary side to the secondary side could cause heating of a secondary side integrated circuit that impacts reliability of the secondary side integrated circuit. For example, excessive junction heating on the secondary side causes thermal shutdown of the secondary side, but transmitter 1602 may be unable to transmit the shutdown signal to the primary side due to a common-mode transient event or fault condition. To reduce or eliminate overstress of devices on the secondary side, timer/oscillator enable circuit 1622 monitors the received feedback signal for a predetermined period of time (e.g., 10 ms). In at least one embodiment, timer/oscillator enable circuit 1622 includes a counter that counts the number of transitions of the received enable/disable feedback control signal provided by receiver 1604 and compares the count to a predetermined threshold count, after the predetermined period. If and insufficient number of transitions of the received feedback signal level occur during that period, timer/oscillator enable circuit 1622 disables oscillator circuit 402 for a second predetermined period (e.g., 10 ms). After expiration of the second predetermined period, timer/oscillator enable circuit 1622 resets. Timer/oscillator enable circuit 1622 continues to monitor and respond any insufficient number of transitions of the received feedback signal until the fault condition disappears and the communications channel and received feedback signal become active again.

In at least one embodiment, power transfer device 1600, includes overvoltage protection circuit 1624 on the secondary side to reduce or eliminate driving a load with a voltage level of output DC signal $V_{DD2}$ that exceeds reliability specifications. For example, a fault may cause the communications channel to malfunction and not update the received feedback signal, which causes oscillator circuit 402 to transfer power for a longer period than necessary to charge capacitor C1 to a voltage level corresponding to first threshold voltage $V_{DD2,MAX}$ and thereby causes the voltage level of output DC signal $V_{DD2}$ to exceed the voltage level corresponding to first threshold voltage $V_{DD2,MAX}$ (e.g., voltages of 9 V for a 5 V $V_{DD2,MAX}$). Such excessive voltage on the secondary side could damage a device in the load. To reduce or eliminate the likelihood of excessive levels of output DC signal $V_{DD2}$, overvoltage protection circuit 1624 draws any excess current on the secondary side and sinks that excess current to ground, thereby clamping the voltage level of output DC signal $V_{DD2}$ and preventing it from further rise. In at least one embodiment, overvoltage protection circuit 1624 includes an active shunt regulator that is configured as an active clamp. An exemplary shut regulator is implemented using feedback circuit techniques that create a scaled version of reference voltage $V_{REF}$ (e.g., 1.1×$V_{REF}$) and compares that scaled version of reference voltage $V_{REF}$ to voltage $V_{SNS}$ using an error amplifier. The output of the error amplifier activates a clamping device if voltage $V_{SNS}$ exceeds the scaled version of reference voltage $V_{REF}$. That clamping device shunts the excess current to ground and regulates voltage $V_{SNS}$ to be approximately equal to the voltage level of the scaled version of reference voltage $V_{REF}$, thereby preventing the voltage level of output DC signal $V_{DD2}$ from rising further. The scaled version of reference voltage $V_{REF}$ sets the active clamping level to be approximately 10% above the nominal voltage level of output DC signal $V_{DD2}$, which is within the reliability limits of an external load. For example, if the target voltage level for output DC signal $V_{DD2}$ is 5V, the active clamp engages when the voltage level of output DC signal $V_{DD2}$ exceeds 5.5V. During normal operation (i.e., a no-fault mode of operation), voltage $V_{SNS}$ is less than 1.1×$V_{REF}$ and the shunt device is inactive in that state. The active clamp may be disabled while the voltage level of output DC signal $V_{DD2}$ ramps up (e.g., during a power-up sequence) and may only be enabled when the voltage level of output DC signal $V_{DD2}$ is close to its regulated voltage level and VDD2_OK indicates no fault condition.

While circuits and physical structures have been generally presumed in describing embodiments of the invention, it is well recognized that in modern semiconductor design and fabrication, physical structures and circuits may be embodied in computer-readable descriptive form suitable for use in subsequent design, simulation, test or fabrication stages. Structures and functionality presented as discrete components in the exemplary configurations may be implemented as a combined structure or component. Various embodiments of the invention are contemplated to include circuits, systems of circuits, related methods, and tangible computer-readable medium having encodings thereon (e.g., VHSIC Hardware Description Language (VHDL), Verilog, GDSII data, Electronic Design Interchange Format (EDIF), and/or Gerber file) of such circuits, systems, and methods, all as described herein, and as defined in the appended claims. In addition, the computer-readable media may store instructions as well as data that can be used to implement the invention. The instructions/data may be related to hardware, software, firmware or combinations thereof.

Thus, a power transfer device having an integrated transformer, a relatively small size, high efficiency, and with built-in fault tolerance, and programmable output voltage, voltage ripple, and frequency of DC/AC power conversion has been described. The description of the invention set forth herein is illustrative, and is not intended to limit the scope of the invention as set forth in the following claims. For example, while the invention has been described in embodiments of a power transfer device, techniques described herein may be combined with other isolation products, e.g., digital isolators, analog isolators, and gate drivers in the same package. Variations and modifications of the embodiments disclosed herein, may be made based on the description set forth herein, without departing from the scope of the invention as set forth in the following claims.

What is claimed is:

1. A power transfer device comprising:
   an oscillator circuit comprising:
   a first node;
   a second node;
   a control terminal;
   a cascode circuit comprising transistors having a first conductivity type and a first breakdown voltage, the cascode circuit being coupled to the control terminal, the first node, and the second node; and
   a latch circuit coupled between the cascode circuit and a first power supply node, the latch circuit comprising cross-coupled transistors, each transistor of the cross-coupled transistors having the first conductivity type and a second breakdown voltage,
   wherein the first breakdown voltage is across a first type of transistor terminal and a second type of transistor terminal,
   wherein the second breakdown voltage is across the first type of transistor terminal and the second type of transistor terminal, and
   wherein the first breakdown voltage is greater than the second breakdown voltage.

2. The power transfer device, as recited in claim 1, wherein the oscillator circuit further comprises a first conductive coil coupled to the first node and the second node to form a primary-side circuit of the power transfer device, a center tap of the first conductive coil being coupled to a second power supply node, and
   wherein the oscillator circuit is configured to develop a pseudo-differential signal on the first node and the second node, the pseudo-differential signal having a peak voltage of at least three times a voltage level of an input DC signal on the second power supply node.

3. The power transfer device, as recited in claim 1, wherein the transistors of the latch circuit comprise:
   a first transistor having a first source terminal coupled to the first power supply node, a first gate terminal coupled to the second node, and a first drain terminal coupled to the first node; and
   a second transistor having a second source terminal coupled to the first power supply node, a second gate terminal coupled to the first node, and a second drain terminal coupled to the second node,
   wherein the cascode circuit comprises:
   a first cascode transistor having a third gate terminal coupled to the control terminal, a third source terminal coupled to the first node, and a third drain terminal coupled to a first terminal of a first conductive coil; and
   a second cascode transistor having a fourth gate terminal coupled to the control terminal, a fourth source terminal coupled to the second node, and a fourth drain terminal coupled to a second terminal of the first conductive coil,
   wherein the first breakdown voltage and the second breakdown voltage are drain-to-source breakdown voltages and the first type of transistor terminal is a drain terminal and the second type of transistor terminal is a source terminal.

4. The power transfer device, as recited in claim 3, wherein the oscillator circuit further comprises:
   a first voltage clamp circuit coupled to the first drain terminal, the first voltage clamp circuit being configured to limit a first gate-to-source voltage of the first transistor to an input voltage level of a DC signal on a second power supply node; and
   a second voltage clamp circuit coupled to the second drain terminal, the second voltage clamp circuit being configured to limit a second gate-to-source voltage of the second transistor to the input voltage level.

5. The power transfer device, as recited in claim 3, further comprising:
   a first clamp transistor of a second type having a first body terminal, a fifth gate terminal, a fifth source terminal, and a fifth drain terminal, the first body terminal being coupled to the first drain terminal, the fifth gate terminal being coupled to a second power supply node, the fifth source terminal being coupled to the first drain terminal, and the fifth drain terminal being coupled to the first power supply node; and
   a second clamp transistor of the second type having a second body terminal, a sixth gate terminal, a sixth source terminal, and a sixth drain terminal, the second body terminal being coupled to the second drain terminal, the sixth gate terminal being coupled to the second power supply node, the sixth source terminal being coupled to the second drain terminal, and the sixth drain terminal being coupled to the first power supply node.

6. The power transfer device, as recited in claim 3, further comprising:
   a first clamp transistor of a second type having a first body terminal, a fifth gate terminal, a fifth source terminal, and a fifth drain terminal, the first body terminal being coupled to a second power supply node, the fifth gate terminal being coupled to the second power supply node, the fifth source terminal being coupled to the first drain terminal, and the fifth drain terminal being coupled to the second power supply node; and
   a second clamp transistor of the second type having a second body terminal, a sixth gate terminal, a sixth source terminal, and a sixth drain terminal, the second body terminal being coupled to the second power supply node, the sixth gate terminal being coupled to the second power supply node, the sixth source terminal being coupled to the second drain terminal, and the sixth drain terminal being coupled to the second power supply node.

7. The power transfer device, as recited in claim 3, further comprising:
   a first snubber circuit coupled between a second power supply node and the first node, the first snubber circuit being configured to limit a first drain voltage of the first cascode transistor to be just above three times an input voltage level of a DC signal on the second power supply node; and
   a second snubber circuit coupled between the second power supply node and the second node, the second snubber circuit being configured to limit a second drain voltage of the second cascode transistor to be just above three times the input voltage level,
wherein the first and second snubber circuits return a portion of clamped energy to the first power supply node and inhibit non-fundamental modes of the oscillator circuit.

8. The power transfer device, as recited in claim 7, wherein the first snubber circuit and the second snubber circuit each include $N_1$ series-coupled, reverse-biased Zener diodes coupled in series with $N_2$ series-coupled, forward-biased diodes, the first and second snubber circuits being configured to clamp the first drain voltage and the second drain voltage, respectively, to a voltage of $N_1 \times V_Z + N_2 \times V_F$, where $N_1$ and $N_2$ are integers greater than zero, $V_Z$ is a knee voltage of the reverse-biased Zener diodes, and $V_F$ is a forward voltage of the forward-biased diodes.

9. The power transfer device, as recited in claim 1, wherein the oscillator circuit is configured to convert an input DC signal on a second power supply node into a first AC signal in response to a control signal on the control terminal.

10. The power transfer device, as recited in claim 1, wherein the oscillator circuit is configured to operate as a Class-D power amplifier.

11. A method for operating a power transfer device, the method comprising:
converting an input DC signal into an output DC signal, the output DC signal being electrically isolated from the input DC signal,
wherein the converting comprises:
biasing an oscillator circuit with the input DC signal; and
generating a first AC signal by selectively enabling the oscillator circuit according to a received feedback signal and a status indicator indicating an operation status of a communications channel across an isolation barrier, the received feedback signal being received using the communications channel.

12. The method, as recited in claim 11, further comprising:
generating the status indicator based on a change in signal level of the received feedback signal provided by the communications channel within a predetermined period.

13. The method, as recited in claim 12, further comprising:
disabling the oscillator circuit for a predetermined period in response to the status indicator indicating a lack of change to a signal level of the received feedback signal within the predetermined period.

14. The method, as recited in claim 11, wherein the converting further comprises:
developing a pseudo-differential signal on a first node of the oscillator circuit and a second node of the oscillator circuit, the pseudo-differential signal having a peak voltage of at least three times an input voltage level of the input DC signal, wherein transistors in a latch circuit of the oscillator circuit each have a breakdown voltage that is just over the input voltage level.

15. The method, as recited in claim 14, wherein the converting further comprises:
clamping gate-to-source voltages of transistors in the latch circuit to a maximum voltage of the input voltage level.

16. The method, as recited in claim 14, wherein the converting further comprises:
limiting voltages on drain terminals of cascode devices in the oscillator circuit to be at most, just over three times the input voltage level, wherein the limiting snubs non-fundamental modes of oscillation of the oscillator circuit and returns excess energy from the cascode devices to an input power supply node receiving the input DC signal.

17. The method, as recited in claim 11, wherein the converting further comprises:
converting the first AC signal into a second AC signal, the first AC signal being electrically isolated from the second AC signal;
generating the output DC signal by rectifying the second AC signal, the output DC signal being electrically isolated from the input DC signal;
generating a feedback signal based on the output DC signal; and
communicating the feedback signal across the isolation barrier using the communications channel.

18. A power transfer device comprising:
a primary-side circuit comprising:
an input power supply node configured to receive an input DC signal; and
an oscillator circuit configured as a power amplifier of a DC/AC power converter responsive to the input DC signal and an oscillator enable signal to provide a first AC signal; and
a circuit configured to generate the oscillator enable signal based on a received feedback signal and a status indicator indicating an operation status of a communications channel across an isolation barrier, the received feedback signal being received via the communications channel.

19. The power transfer device, as recited in claim 18, wherein the circuit includes a timer configured to assert a timeout signal in response to a lack of change of a state of the received feedback signal within a predetermined period.

20. The power transfer device, as recited in claim 18, further comprising:
a transformer configured to convert the first AC signal to a second AC signal; and
a secondary-side circuit electrically isolated from the primary-side circuit, and configured to convert the second AC signal to an output DC signal, the secondary-side circuit comprising:
an output power supply node; and
a second circuit configured to generate a feedback signal based on a predetermined reference voltage and the output DC signal on the output power supply node,
wherein the secondary-side circuit further comprises an isolation channel transmitter configured to transmit the feedback signal across the isolation barrier using the communications channel, and
wherein the primary-side circuit further comprises an isolation channel receiver configured to receive the received feedback signal from the secondary-side circuit via the communications channel.

* * * * *